United States Patent [19]

Yamate

[11] Patent Number: 5,223,799
[45] Date of Patent: Jun. 29, 1993

[54] PARABOLIC SIGNAL GENERATOR

[75] Inventor: Kazunori Yamate, Ibaraki, Japan

[73] Assignee: Matsushita Electric Industrial Co., Ltd., Osaka, Japan

[21] Appl. No.: 909,706

[22] Filed: Jul. 7, 1992

[30] Foreign Application Priority Data

Jul. 12, 1991 [JP] Japan .................. 3-172537

[51] Int. Cl.$^5$ .................. H03K 4/08; G06G 7/12
[52] U.S. Cl. .................. 328/145; 307/228; 307/261; 307/490
[58] Field of Search .................. 307/228, 261, 490; 328/145

[56] References Cited

U.S. PATENT DOCUMENTS

| | | | |
|---|---|---|---|
| 4,849,652 | 7/1989 | Hulshof .................. | 307/261 |
| 5,051,608 | 9/1991 | Ten Pierick et al. .................. | 307/490 |
| 5,146,108 | 9/1992 | Tamura et al. .................. | 307/261 |

FOREIGN PATENT DOCUMENTS 0082811  3/1990  Japan .................. 307/261

Primary Examiner—William L. Sikes
Assistant Examiner—Margaret Rose Wambach
Attorney, Agent, or Firm—Stevens, Davis, Miller & Mosher

[57] ABSTRACT

In a parabolic signal generator, a sync pulse is applied to a saw-tooth wave generation circuit, the output of the saw-tooth wave generation circuit is entered to an absolute value circuit, the output of the absolute value circuit is entered to a logarithmic amplifier, the output of the logarithmic amplifier is entered to a linear amplifier, and the output of the linear amplifier is entered to an antilogarithmic amplifier. The absolute value circuit, logarithmic amplifier, linear amplifier and antilogarithmic amplifier are powered by a single-voltage power source, and these circuit and appliers have reference input terminals supplied with a common bias voltage.

2 Claims, 1 Drawing Sheet

PARABOLIC SIGNAL GENERATOR

BACKGROUND OF THE INVENTION

This invention relates to a parabolic signal generator used with the deflection circuit and dynamic focusing circuit (will be termed "DAF" hereinafter) of television receivers and display apparatus.

In order to improve the focus characteristics of the cathode ray tube (will be termed "CRT" hereinafter) used in recent television receivers and display apparatus having large screens, DAF circuits are introduced so as to improve the peripheral focus characteristics of the CRT. This purpose is achieved by operating the DAF circuit to generate a parabolic waveform and applying the waveform to the focus terminal of the CRT.

The following explains a conventional parabolic signal generator. FIG. 2 shows the conventional parabolic signal generator. In FIG. 2, symbol 1 denotes a sawtooth wave generation circuit, 3 is an absolute value circuit, 5, 7, 10, 14, 17 and 24 are resistors, and 6, 8, 9, 11, 12, 13, 15 and 16 are diodes.

The operation of the foregoing conventional circuit arrangement will be explained. The saw-tooth wave generation circuit 1 converts a current flowing in the deflection coil into a voltage shown in FIG. 3A, the absolute value circuit 3 folds the saw-tooth waveform with respect to its center to produce a waveform shown in FIG. 3B, and a polygonal approximation circuit formed of the resistors 5, 7, 10, 14, 17 and 24 and the diodes 6, 8, 9, 11, 12, 13, 15 and 16 operates to make parallel connections of registers in response to the conduction of sets of diodes which are in serial connection with the respective resistors, so that a parabolic waveform is produced.

SUMMARY OF THE INVENTION

However, in the foregoing conventional arrangement based on the characteristics of diode, the parabolic waveform fluctuates due to the thermal characteristics of the diodes, and in addition the number of resistors and diodes must be changed for changing the waveform parameter of the parabolic wave (generally, a parabolic waveform is defined for the input X and output Y as:

$$Y = X^\alpha \quad (1)$$

where $\alpha$ is a real number) when the focus characteristics of CRT is altered or the CRT screen size is altered.

The present invention is intended to solve the foregoing prior art deficiency, and its object is to provide a parabolic signal generator which realizes the expression (1) by means of a logarithmic amplifier, a linear amplifier and an antilogarithmic amplifier. The logarithmic amplifier needs to have an input voltage which is higher than its reference voltage because of the definition of logarithm in the range of positive real numbers, and on this account the absolute value circuit which precedes the logarithmic amplifier has its reference voltage made equal to that of the logarithmic amplifier so that the input of the logarithmic amplifier does not fall undefined.

In order to achieve the above objective, the inventive parabolic signal generator is designed to apply a sync pulse to a saw-tooth wave generation circuit, enter the output of the saw-tooth wave generation circuit to an absolute value circuit, enter the output of the absolute value circuit to a logarithmic amplifier, enter the output of the logarithmic amplifier to a linear amplifier, and enter the output of the linear amplifier to an antilogarithmic amplifier. The absolute value circuit, logarithmic amplifier, linear amplifier and antilogarithmic amplifier are powered by a single-voltage power source, and these circuit and amplifiers have their reference input terminals supplied with a common bias voltage.

Based on the foregoing arrangement, the parameter $\alpha$ of the expression (1) can be determined by setting the gain of the linear amplifier (generally, it is given as a ratio of resistances of two resistors), and when the $\alpha$ is determined as characteristics of CRT, the gain of the linear amplifier is simply set to $\alpha$, and the input voltage to the logarithmic amplifier is guarantied to be higher than the reference voltage of the logarithmic amplifier.

DESCRIPTION OF THE PREFERRED EMBODIMENT

Figure 1:
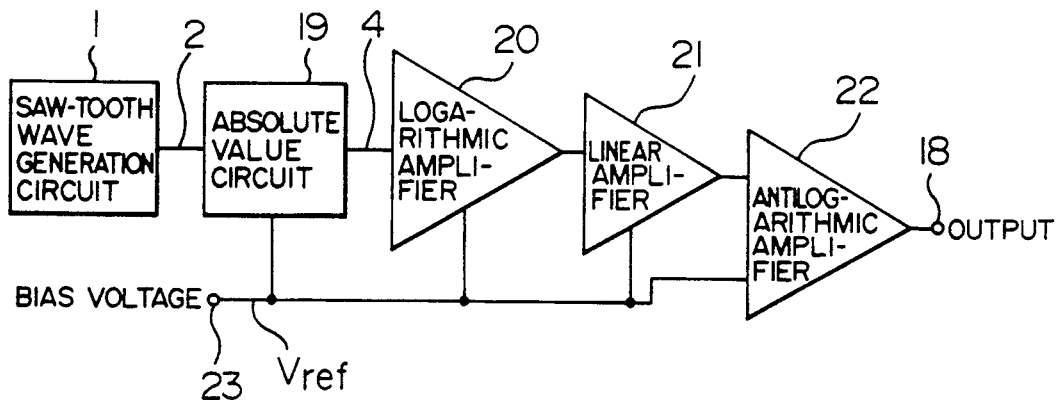
FIG. 1 is a block diagram of the parabolic signal generator based on an embodiment of this invention.
Figure 2:
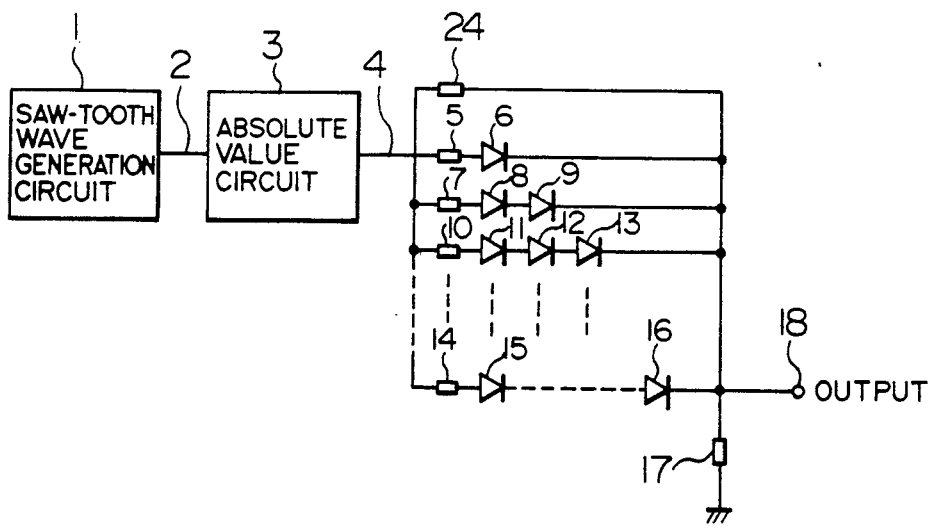
FIG. 2 is a schematic diagram of the conventional parabolic signal generator.

An embodiment of this invention will be described with reference to the drawings In FIG. 1, symbol 1· denotes a saw-tooth wave generation circuit, 2 is a sawtooth wave signal, 19 is an absolute value circuit which receives the saw-tooth wave signal, 4 is an output signal of the absolute value circuit, 20 is a linear amplifier which receives the output of the absolute value circuit, 21 is a linear amplifier which receives the output of the logarithmic amplifier, 22 is an antilogarithmic amplifier which receives the output of the linear amplifier, 23 is a reference voltage input terminal, and 18 is an output terminal for the output which is expressed as Y in the expression (1) (in which $\alpha$ denotes the gain of the linear amplifier 21).

The operation of the parabolic signal generator arranged as described above will be explained on FIGS. 3A and 3B.

Figure 3A:
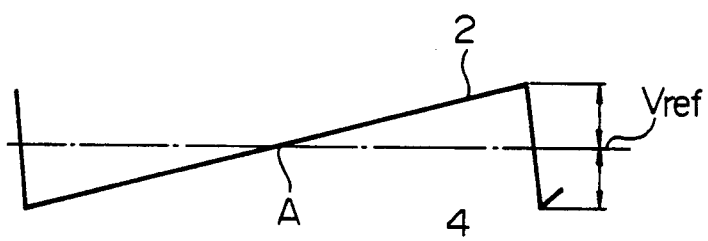
FIG. 3A is a waveform diagram of the saw-tooth wave signal.
Figure 3B:
FIG. 3B is a waveform diagram of the output signal of the absolute value circuit.

The saw-tooth wave signal 2 shown in FIG. 3A is applied to the absolute value circuit 19, which then produces the output signal 4 shown in FIG. 3B. The reference voltage Vref is set to the level which crosses the center of the saw-tooth wave signal 2 as shown in FIG. 3A. Accordingly, point A in FIGS. 3A and 3B does not fall below the reference voltage Vref, and thus it does not become an undefined voltage for the logarithmic amplifier 20 located in the following stage.

The expression (1) is realized by the operations of the logarithmic amplifier 20, linear amplifier 21 and antilogarithmic amplifier 22 as follows.

The output $Y_1$ of the logarithmic amplifier 20, the output $Y_a$ of the linear amplifier 21, and the output $Y_0$ of the antilogarithmic amplifier 22 are given as functions of the input voltage X as follows.

$$Y_1 = \log X \quad (2)$$

$$Y_a = \alpha \log X = \log X^\alpha \quad (3)$$

$$Y_0 = \log X^{-1}(\log X^\alpha) = X^\alpha \quad (4)$$

According to this invention, as described above, the logarithmic amplifier does not have undefined regions through the provision of a common reference voltage for the absolute value circuit, logarithmic amplifier, linear amplifier and antilogarithmic amplifier. Moreover, the parameter α of the expression (1) can be altered by setting the gain of the linear amplifier arbitrarily, whereby the signal generator can readily be modified when the CRT is switched to another type. The operation expressed by the expressions (1), (2), (3) and (4) produces accurate parabolic waveforms. Consequently, the parabolic waveform signal generator based on this invention can be designed efficiently, the circuit arrangement shown in FIG. 1 is suitable for circuit integration for cost reduction, and the influence of the thermal characteristics of diode on the waveform, which is encountered in the prior art circuit arrangement, can be eliminated according to this invention.

I claim:

1. A parabolic signal generator in which a sync pulse is applied to a saw-tooth wave generation circuit, the output of said saw-tooth wave generation circuit is entered to an absolute value circuit, the output of said absolute value circuit is entered to a logarithmic amplifier, the output of said logarithmic amplifier is entered to a linear amplifier, and the output of said linear amplifier is entered to an antilogarithmic amplifier.

2. A parabolic signal generator according to claim 1, wherein said absolute value circuit, logarithmic amplifier, linear amplifier and antilogarithmic amplifier are powered by a single-voltage power source, and said absolute value circuit, logarithmic amplifier, linear amplifier and antilogarithmic amplifier have reference input terminals supplied with a common bias voltage.

* * * * *